United States Patent [19]

Takahara

[11] Patent Number: 5,276,349
[45] Date of Patent: Jan. 4, 1994

[54] SEMICONDUCTOR INTEGRATED CIRCUIT DEVICE
[75] Inventor: Seiji Takahara, Itami, Japan
[73] Assignee: Mitsubishi Denki Kabushiki Kaisha, Tokyo, Japan
[21] Appl. No.: 976,431
[22] Filed: Nov. 13, 1992
[30] Foreign Application Priority Data Apr. 27, 1992 [JP] Japan .................. 4-107437

[51] Int. Cl.$^5$ ............. H01L 27/14; H01L 27/02
[52] U.S. Cl. .................. 257/435; 257/459; 257/536; 257/659; 257/773
[58] Field of Search ............ 257/435, 458, 459, 532, 257/536, 577, 659, 773, 734, 774

Primary Examiner—Mark V. Prenty
Attorney, Agent, or Firm—Oblon, Spivak, McClelland, Maier & Neustadt

[57] ABSTRACT

A semiconductor integrated circuit device with a built-in photosensor is provided with a light shielding aluminum film which is formed on a whole surface of the semiconductor integrated circuit device continuously to prevent faulty operation of the semiconductor integrated circuit because of incident light. In order to reduce parasitic capacity generated between a light shielding aluminum film and a wiring for transmitting a high-frequency signal or other elements whereto a high-frequency signal is applied, a light shielding aluminum film is partially removed on the wiring and other elements as well as a photosensor and a pad.

20 Claims, 14 Drawing Sheets

SEMICONDUCTOR INTEGRATED CIRCUIT DEVICE

BACKGROUND OF THE INVENTION

1. Field of the Invention

The present invention relates to a semiconductor integrated circuit device with a built-in photosensor (referred to as "IC with a built-in photosensor" hereinafter), and more particularly relates to techniques for improving electric characteristics of the IC with a built-in photosensor.

2. Description of the Background Art

A frequency of an analogue signal which is employed in an IC for a compact disk player to detect a light signal has been about 5 MHz. Recently, however, a request for processing a high-frequency signal of 20 MHz is increasing, particularly in an IC for a laser disk. Consequently, it is necessary to improve frequency characteristics of an IC with a built-in photosensor to a high-frequency signal. A conventional IC device with a built-in photosensor will be described with reference to FIG. 8. FIG. 8 is a plan view of a chip of an IC with a built-in photosensor employed in an IC for an optical pickup of a compact disk player and the like.

In the figure, numeral 1 denotes a light shielding aluminum film, numeral 2 denotes a pad for connecting a lead wire, numerals 3, 4 denote photosensors for detecting light. In the conventional IC device with a built-in photosensor, the whole chip except the photosensors 3, 4 for sensing light and the pad 2 is shielded from light with the light shielding aluminum film 1 to prevent faulty operation of a circuit because of an incident light.

Next, an outline of part of an integrated circuit for processing light signals detected by the photosensor 3 of the IC device with a built-in photosensor shown in FIG. 8 will be described with reference to FIG. 9. FIG. 9 is a block diagram showing a structure of an integrated circuit for processing a signal detected by a photosensor. In the figure, numeral 5 denotes a wiring, one end of which is connected to an output end of the photosensor 3, for transmitting a signal detected by the photosensor 3, numeral 6 denotes a capacitor, which is connected to the other end of the wiring 5, and a signal detected by the photosensor 3 is applied thereto, numeral 7 denotes a current-voltage converter circuit, an input end of which is connected to the wiring 5, for converting a signal detected by the photosensor 3 into a voltage, numeral 8 denotes a wiring for transmitting a signal passing through the capacitor, numeral 9 denotes a high-frequency amplifier for processing a high-frequency signal detected by the photosensor 3, numeral 10 denotes a wiring for transmitting a signal from the photosensor 4 and B1 through B8 denote signal processing blocks for processing an output signal from the photosensors 3, 4; B1 through B4 denote blocks for detecting a signal outputted from the photosensor 3, B5 denotes a high pass filter which passes only high-frequency signals among signals detected by the photosensor 3, B6 denotes a block for processing a high-frequency signal and B7 and B8 denote blocks for detecting if the photosensor 4 senses light. Accordingly, a high-frequency signal outputted from the photosensor is inputted to the high-frequency amplifier 9 passing through the wiring 5, the capacitor 6 and the wiring 8.

FIG. 10 is an enlarged view of the photosensor 3 and its vicinities. In FIG. 10, numeral 11 denotes a pad for connecting the photosensor 3 and the wiring 5. FIG. 11 is a perspective view taken along the lines C—C of FIG. 10 observed in the direction of the arrows. In FIG. 11, numeral 1 denotes a conductive light shielding film, numeral 15 denotes a layer insulating film and k1 denotes a peripheral region of the wiring 5. Other identical numerals with FIG. 8 indicate the same or corresponding parts of FIG. 8. As shown in the figure, parasitic capacity is generated between the wiring 5 and the aluminum light shielding film 1 in the region k1.

Generally, an overlapping portion of conductive layers, such as the conductive light shielding film 1 and the wiring 5 with the layer insulating film 15 in between shown in FIG. 12, can be regarded as equivalent to a parallel-plate capacitor consisting of two parallel conductive plates 20 shown in FIG. 13. Assuming the symbol C represents capacity of this capacitor, the symbol $\epsilon_r$ the relative dielectric constant of a substance in between two flat plates 20, the symbol d the distance between two flat plates 20, the symbol S the area of the flat plate 20 and the symbol $\epsilon_0$ the dielectric constant of vacuum, the following relation holds:

$$C = \epsilon_0 \epsilon_r S / d \tag{1}$$

Accordingly, when the area wherein parasitic capacity can be generated becomes larger by employing a relatively large capacitor, long wiring or the like, parasitic capacity increases, so that the influence becomes great.

Next, FIG. 14 is a sectional view of a capacitor formed on a substrate. In the figure, numeral 21 denotes an aluminum electrode, numeral 22 denotes an N type semiconductor diffused layer, numeral 23 denotes a P type semiconductor diffused layer, numeral 24 denotes a nitride film, numeral 25 denotes an epitaxial growth layer and other identical numerals with FIG. 11 indicate the same or corresponding parts of FIG. 11. Parasitic capacity is generated at a region k2 where the aluminum electrode 21 and the light shielding aluminum film 1 are facing each other in this capacitor.

Since the conventional semiconductor integrated circuit device is structured as mentioned above, the light shielding aluminum film 1 covering over the whole chip generates parasitic capacity between itself and an element such as a wiring or a capacitor formed thereunder, as shown in FIG. 12. Particularly, since the high-frequency amplifier 9 formed in the IC is an amplifier for a light signal picked up by the photosensor 3 and the input impedance of the high-frequency amplifier 9 is high-impedance, there is the disadvantage that circuit characteristics such as frequency characteristics or the like are greatly deteriorated by the parasitic capacity in a line connected to an input end of the high-frequency amplifier 9.

SUMMARY OF THE INVENTION

According to the first aspect of the present invention, a semiconductor integrated circuit device comprises: a substrate; a photosensor (or photodetector) formed on the substrate; an integrated circuit formed on the substrate, having a circuit region which processes a high-frequency signal, for processing a signal outputted from the photosensor; a pad formed on the substrate, the pad being employed for connecting the integrated circuit to an external element so that a signal can be input to/output from the integrated circuit; and a conductive light shielding film formed on the whole surface of the substrate except at least a portion of the circuit region for processing a high-frequency signal and a region whereon the photosensor and the pad are formed.

The conductive light shielding film according to the first aspect of the present invention is formed on the whole surface of the substrate except at least a portion of the circuit region for processing a high-frequency signal and the region whereon the photosensor and the pad are formed. The conductive light shielding film, being formed on the whole surface of the substrate, can sufficiently prevent light coming into the whole region except a region whereon the conductive light shielding film is not formed. In addition, since the conductive light shielding film is not formed on at least a portion of the circuit region for processing a high-frequency signal, the generation of parasitic capacity between the circuit region for processing a high-frequency signal and the conductive light shielding film can be reduced.

Thus, the semiconductor integrated circuit device in accordance with the first aspect of the present invention comprises an integrated circuit formed on a substrate, having a circuit region which processes a high-frequency signal, for processing a signal outputted from a photosensor, and a conductive light shielding film formed on the whole surface of the substrate except at least a portion of the circuit region for processing a high-frequency signal. The conductive light shielding film formed on the whole surface of the substrate can prevent faulty operation caused by light ingress. In addition, parasitic capacity in the region wherein a high-frequency signal is processed can be reduced by not forming the conductive light shielding on at least a portion of the region wherein a high-frequency signal is processed or a photosensor and a pad are formed; this is effective in that high-frequency characteristics of a semiconductor integrated circuit can be improved without complicating the structure or manufacturing process.

In the second aspect of the present invention, a semiconductor integrated circuit device comprises: a substrate; a photosensor formed on the substrate; an integrated circuit formed on the substrate, having a wiring which transmits a high-frequency signal, for processing a signal outputted from the photosensor; a pad formed on the substrate, the pad being employed for connecting the integrated circuit to an external element so that a signal can be input to output from the integrated circuit; and a conductive light shielding film formed on the whole surface of the substrate except at least a portion of the wiring and a region whereon the photosensor and the pad are formed.

The conductive light shielding film according to the second aspect of the present invention is formed on the whole surface of the substrate except at least a portion of the wiring for transmitting a high-frequency signal outputted from the photosensor and the region whereon the photosensor and the pad are formed. The conductive light shielding film, being formed on the whole surface of the substrate, can sufficiently prevent light coming into the whole region except a region whereon the conductive light shielding film is not formed. In addition, since the conductive light shielding film is not formed on at least a portion of the wiring for transmitting a high-frequency signal, the generation of parasitic capacity between the wiring for transmitting a high-frequency signal and the conductive light shielding film can be reduced.

Thus, the semiconductor integrated circuit device in accordance with the second aspect of the present invention comprises an integrated circuit formed on a substrate, having a wiring which transmits a high-frequency signal, for processing a signal outputted from a photosensor, and a conductive light shielding film formed on the whole surface of the substrate except at least a portion of the wiring and a region whereon the photosensor and the pad are formed. The conductive light shielding film formed on the whole surface of the substrate can prevent faulty operation caused by light ingress. In addition, parasitic capacity in the region wherein a high-frequency signal is processed can be reduced by not forming the conductive light shielding on at least a portion of the wiring for transmitting a high-frequency signal; this is effective in that high-frequency characteristics of a semiconductor integrated circuit can be improved without complicating the structure or manufacturing process.

In the third aspect of the present invention, a semiconductor integrated circuit device comprises: a substrate; a photosensor formed on the substrate; an integrated circuit formed on the substrate, having a capacitor whereto a high-frequency signal is applied, for processing a signal outputted from the photosensor; a pad formed on the substrate, the pad being employed for connecting the integrated circuit to an external element so that a signal can be input to / output from the integrated circuit; and a conductive light shielding film formed on the whole surface of the substrate except at least a portion of the capacitor and a region whereon the photosensor and the pad are formed.

The conductive light shielding film according to the third aspect of the present invention is formed on the whole surface of the substrate except at least a portion of the capacitor whereto a high-frequency signal is applied and the region whereon the photosensor and the pad are formed. The conductive light shielding film, being formed on the whole surface of the substrate, can sufficiently prevent light coming into the whole region except a region whereon the conductive light shielding film is not formed. In addition, since the conductive light shielding film is not formed on at least a portion of the capacitor whereto a high-frequency signal is applied, the generation of parasitic capacity between a capacitor electrode and the conductive light shielding film can be reduced.

Thus, the semiconductor integrated circuit device in accordance with the third aspect of the present invention comprises an integrated circuit formed on a substrate, having a capacitor whereto a high-frequency signal is applied, for processing a signal outputted from a photosensor, and a conductive light shielding film formed on the whole surface of the substrate except at least a portion of the capacitor and a region whereon the photosensor and the pad are formed. The conductive light shielding film formed on the whole surface of the substrate can prevent faulty operation caused by light ingress. In addition, parasitic capacity in the capacitor electrode whereto a high-frequency signal is applied can be reduced by not forming the conductive light shielding on at least a portion of the capacitor whereto a high-frequency signal is applied; this is effective in that high-frequency characteristics of a semiconductor integrated circuit can be improved without complicating the structure or manufacturing process.

In the fourth aspect of the present invention, a semiconductor integrated circuit device comprises: a substrate; a photosensor formed on the substrate; an integrated circuit formed on the substrate, having a resistor whereto a high-frequency signal is applied, for processing a signal outputted from the photosensor; a pad formed on the substrate, the pad being employed for connecting the integrated circuit to an external element so that a signal can be input to / output from the integrated circuit; and a conductive light shielding film formed on the whole surface of the substrate except at least a portion of the resistor and a region whereon the photosensor and the pad are formed.

The conductive light shielding film according to the fourth aspect of the present invention is formed on the whole surface of the substrate except at least a portion of the resistor whereto a high-frequency signal is applied and the region whereon the photosensor and the pad are formed. The conductive light shielding film, being formed on the whole surface of the substrate, can sufficiently prevent light coming into the whole region except a region whereon the conductive light shielding film is not formed. In addition, since the conductive light shielding film is not formed on at least a portion of the resistor whereto a high-frequency signal is applied, the generation of parasitic capacity between a resistor and the conductive light shielding film can be reduced.

Thus, the semiconductor integrated circuit device in accordance with the fourth aspect of the present invention comprises an integrated circuit formed on a substrate, having a resistor whereto a high-frequency signal is applied, for processing a signal outputted from a photosensor, and a conductive light shielding film formed on the whole surface of the substrate except at least a portion of the resistor and a region whereon the photosensor and the pad are formed. The conductive light shielding film formed on the whole surface of the substrate can prevent faulty operation caused by light ingress. In addition, parasitic capacity in the resistor whereto a high-frequency signal is applied can be reduced by not forming the conductive light shielding on at least a portion of the resistor whereto a high-frequency signal is applied; this is effective in that high-frequency characteristics of a semiconductor integrated circuit can be improved without complicating the structure or manufacturing process.

In the fifth aspect of the present invention, a semiconductor integrated circuit device comprises: a substrate; a photosensor formed on the substrate; an integrated circuit formed on the substrate, having a transistor which processes a high-frequency signal, for processing a signal outputted from the photosensor; a pad formed on the substrate, the pad being employed for connecting the integrated circuit to an external element so that a signal can be input to / output from the integrated circuit; and a conductive light shielding film formed on the whole surface of the substrate except at least a portion of the transistor and a region whereon the photosensor and the pad are formed.

The conductive light shielding film according to the fifth aspect of the present invention is formed on the whole surface of the substrate except at least a portion of the transistor whereto a high-frequency signal is applied and the region whereon the photosensor and the pad are formed. The conductive light shielding film, being formed on the whole surface of the substrate, can sufficiently prevent light coming into the whole region except a region whereon the conductive light shielding film is not formed. In addition, since the conductive light shielding film is not formed on at least a portion of the transistor whereto a high-frequency signal is applied, the generation of parasitic capacity between a transistor electrode and the conductive light shielding film can be reduced.

Thus, the semiconductor integrated circuit device in accordance with the fifth aspect of the present invention comprises an integrated circuit formed on a substrate, having a transistor which processes a high-frequency signal, for processing a signal outputted from a photosensor, and a conductive light shielding film formed on the whole surface of the substrate except at least a portion of the transistor and a region whereon the photosensor and the pad are formed. The conductive light shielding film formed on the whole surface of the substrate can prevent faulty operation caused by light ingress. In addition, parasitic capacity in the transistor for processing a high-frequency signal can be reduced by not forming the conductive light shielding on at least a portion of the transistor for processing a high-frequency signal; this is effective in that high-frequency characteristics of a semiconductor integrated circuit can be improved without complicating the structure or manufacturing process.

Accordingly, an object of the present invention is to provide a semiconductor integrated circuit device which is adapted to processing a high-frequency signal by reducing parasitic capacity, which is a cause of deterioration of high-frequency characteristics, without adding new parts or complicated process.

These and other objects, features, aspects and advantages of the present invention will become more apparent from the following detailed description of the present invention when taken in conjunction with the accompanying drawings.

DESCRIPTION OF THE PREFERRED EMBODIMENTS

Now, a first preferred embodiment according to the present invention will be described with reference to FIG. 1.

Figure 1:
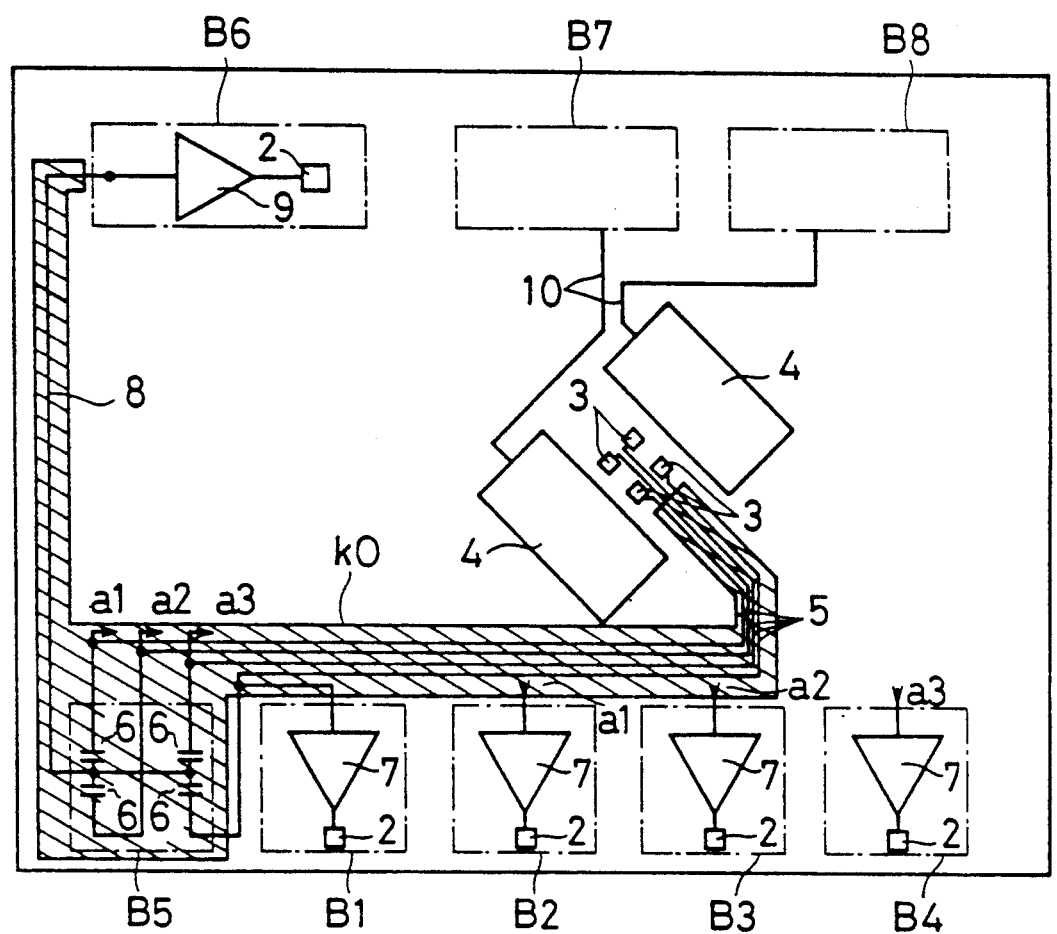
FIG. 1 is a block diagram showing a structure of a semiconductor integrated circuit device with a built-in photosensor according to a first preferred embodiment of the present invention.
Figure 2:
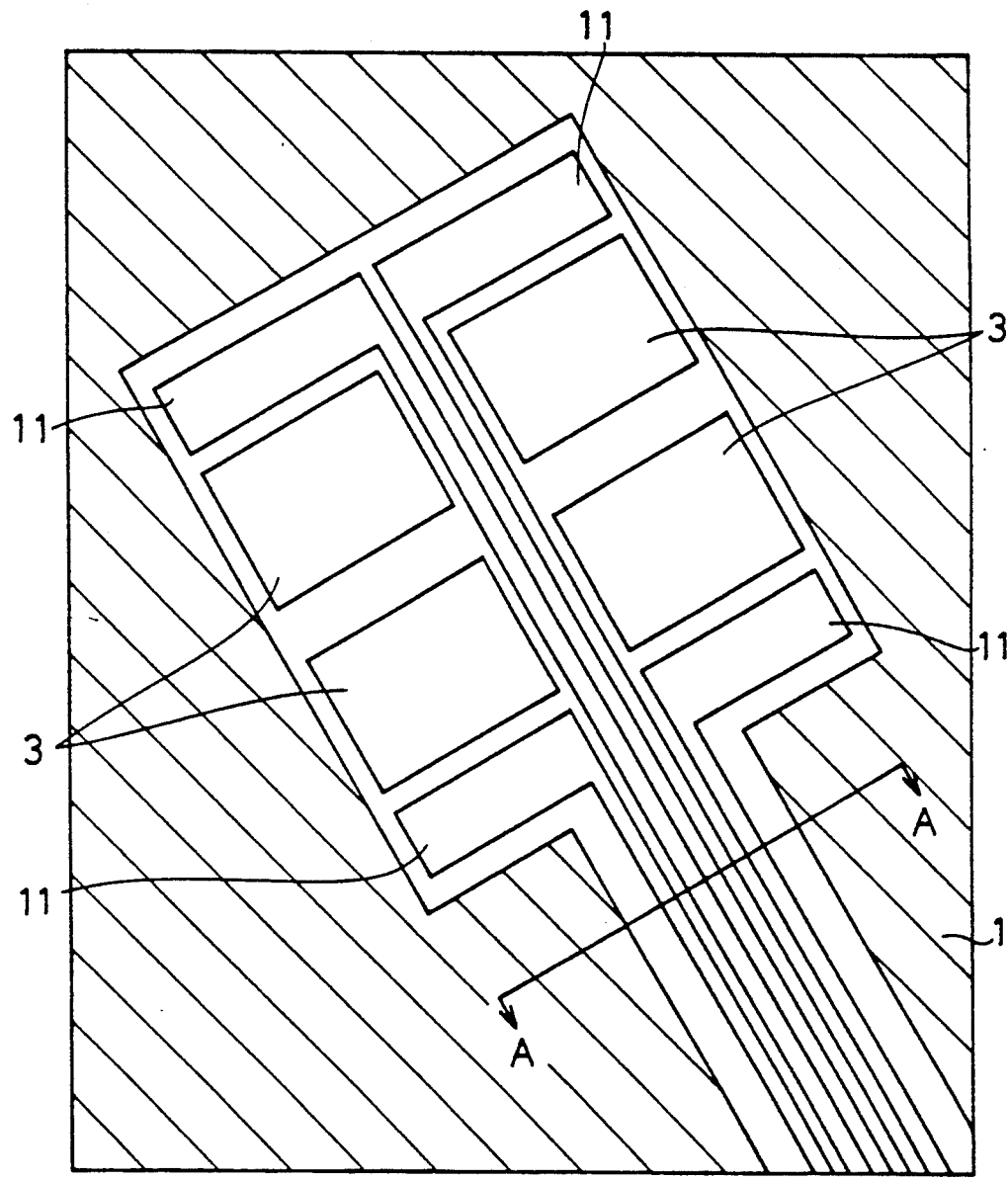
FIG. 2 is a plan view showing the photosensors and their vicinities shown in FIG. 1.
Figure 3:
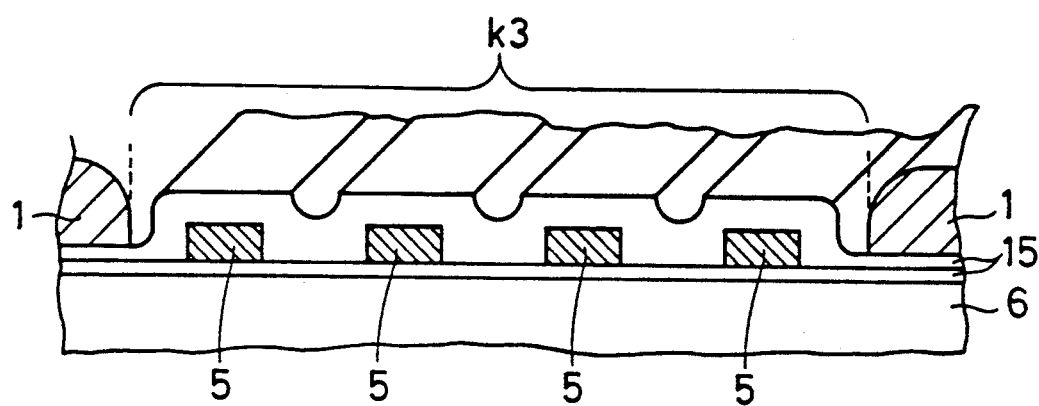
FIGS. 3 is a perspective view taken in the section A—A of FIG. 2.
Figure 9:
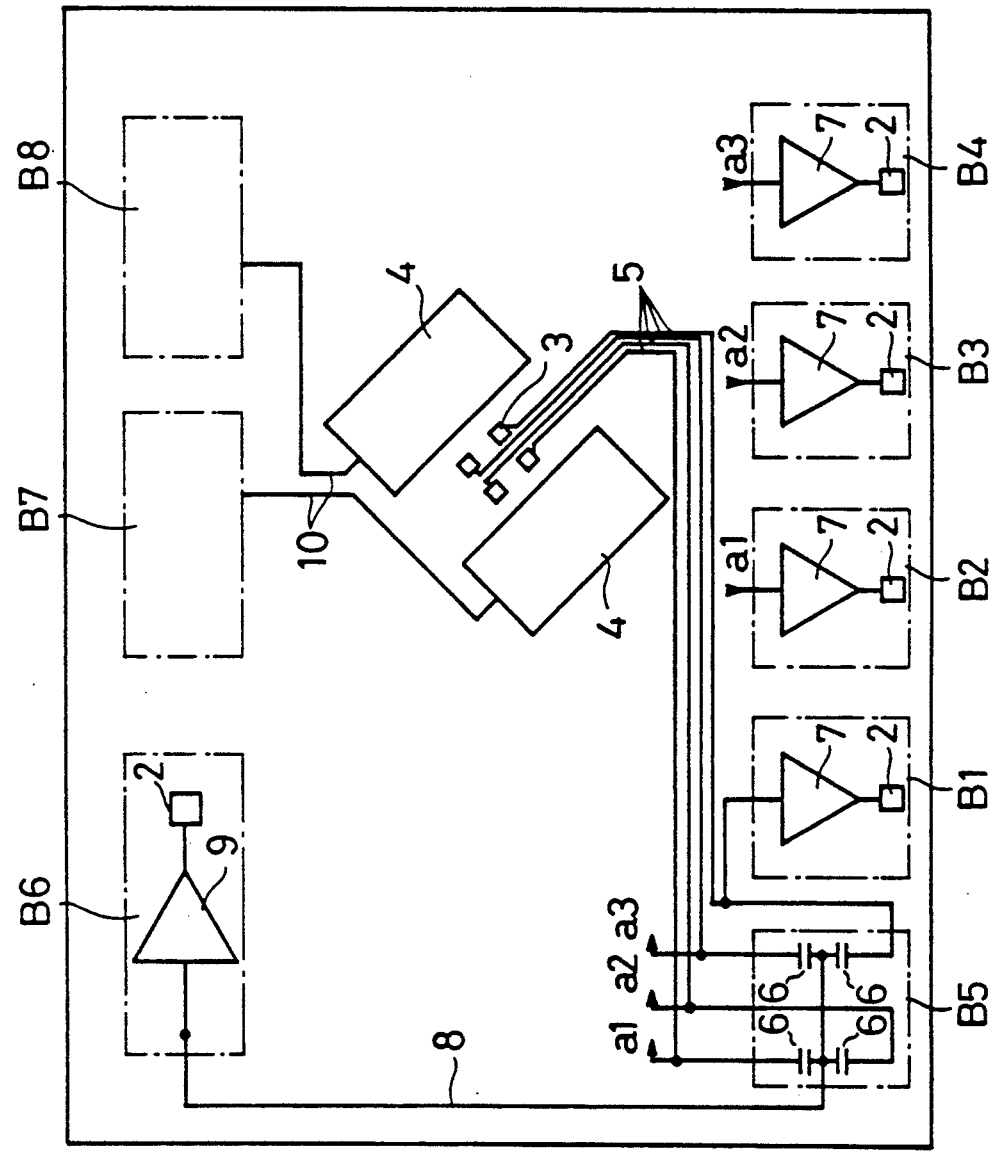
FIG. 9 is a block diagram showing a structure of the semiconductor integrated circuit device shown in FIG. 8.
Figure 10:
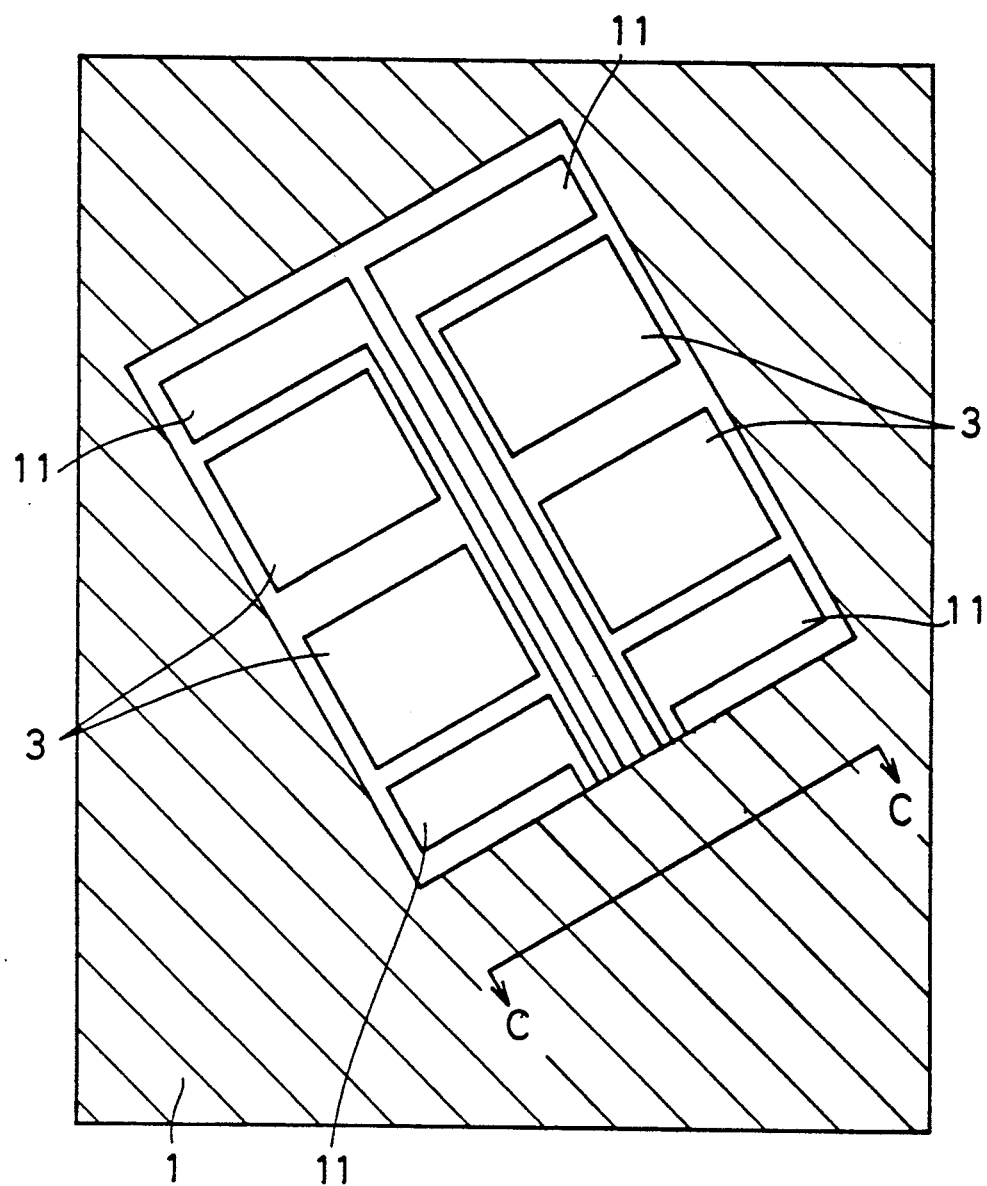
FIG. 10 is a plan view showing the photosensors and their vicinities shown in FIG. 8.
Figure 11:
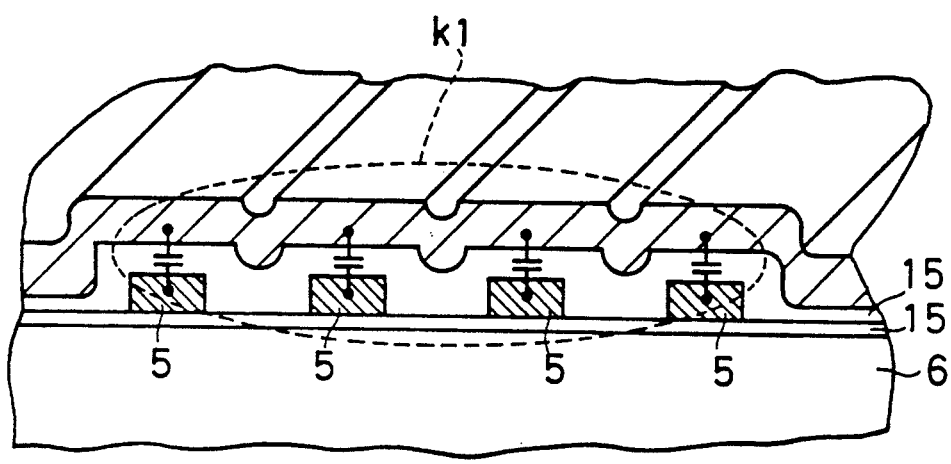
FIG. 11 is a perspective view taken in the section C—C of FIG. 10.
Figure 12:
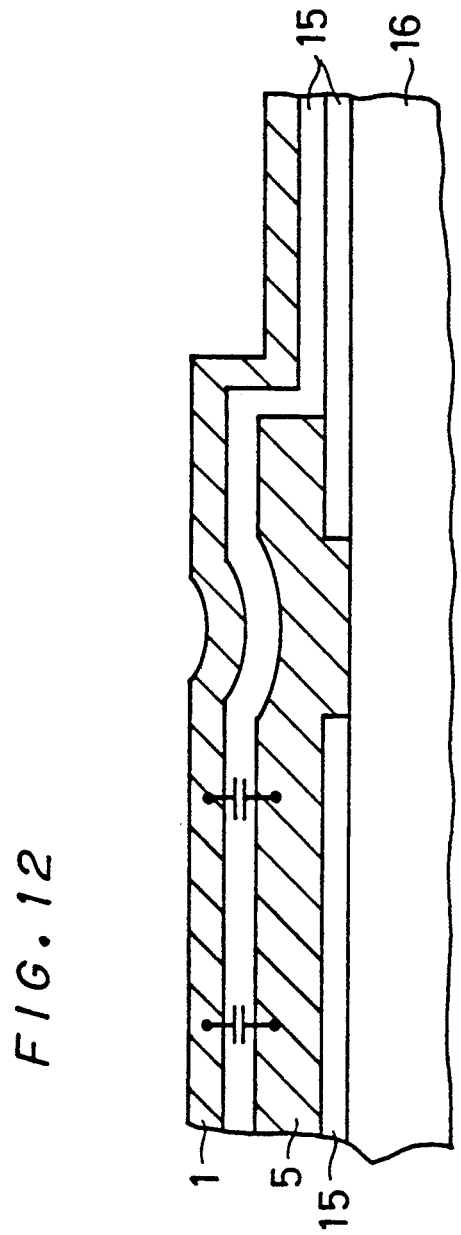
FIG. 12 illustrates parasitic capacity generated between a light shielding aluminum film and a wiring.
Figure 13:
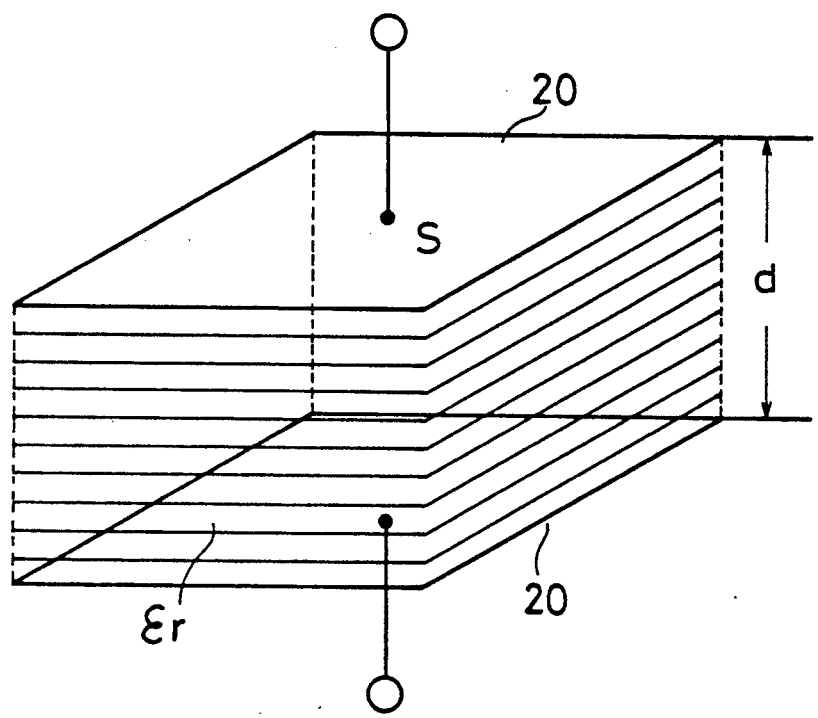
FIG. 13 is a perspective view of a parallel-plate capacitor for illustrating parasitic capacity generated between a light shielding aluminum film and a wiring.

FIG. 1 is a block diagram showing a structure of a semiconductor integrated circuit device according to a first preferred embodiment of the present invention. In FIG. 1, identical numerals with FIG. 9 indicate the same or corresponding parts of FIG. 9. The semiconductor integrated circuit shown in FIG. 1 according to the present invention is different from a conventional semiconductor integrated circuit in that at least a portion of a light shielding aluminum film on a wiring 5, a capacitor 6 and a wiring 8 in a region k0 is removed. A light information detected by a photosensor 3 is converted to an electric information, and the electric information is transmitted through the wiring 5 to each of the signal processing blocks B1-B6 to be processed therein. Since the output signal from the photosensor 3 includes a high-frequency signal, there is great influence of parasitic capacity when it is generated. Therefore, the light shielding aluminum film on the wiring 5 is removed. The light shielding aluminum film, however, remains on a portion of the wiring 5 where the light shielding aluminum film is necessary. FIGS. 2 and 3 illustrate the state where the light shielding aluminum film is removed. FIG. 2 is an enlarged plan view showing the photosensors 3 and their vicinities. In FIG. 2, numeral 1 denotes the light shielding aluminum film, numeral 11 denotes a pad for connecting the photosensor 3 and the wiring 5 and other identical numerals with FIG. 1 indicate the same or corresponding parts of FIG. 1. As shown in FIG. 2, the light shielding aluminum film 1 is not formed on the wiring 5. FIG. 3 is a perspective view taken along the section A—A of FIG. 2 observed in the direction of the arrows. In the future, numeral 6 denotes a substrate, numeral 15 denotes a layer insulating film and k3 denotes a region where the light shielding aluminum film is removed. Compared with the sectional view of wirings in the conventional semiconductor integrated circuit device shown in FIG. 11, it is seen that parasitic capacity is not generated on the region k3 of FIG. 3 while it is generated on the region k1 of FIG. 11.

Figure 4:
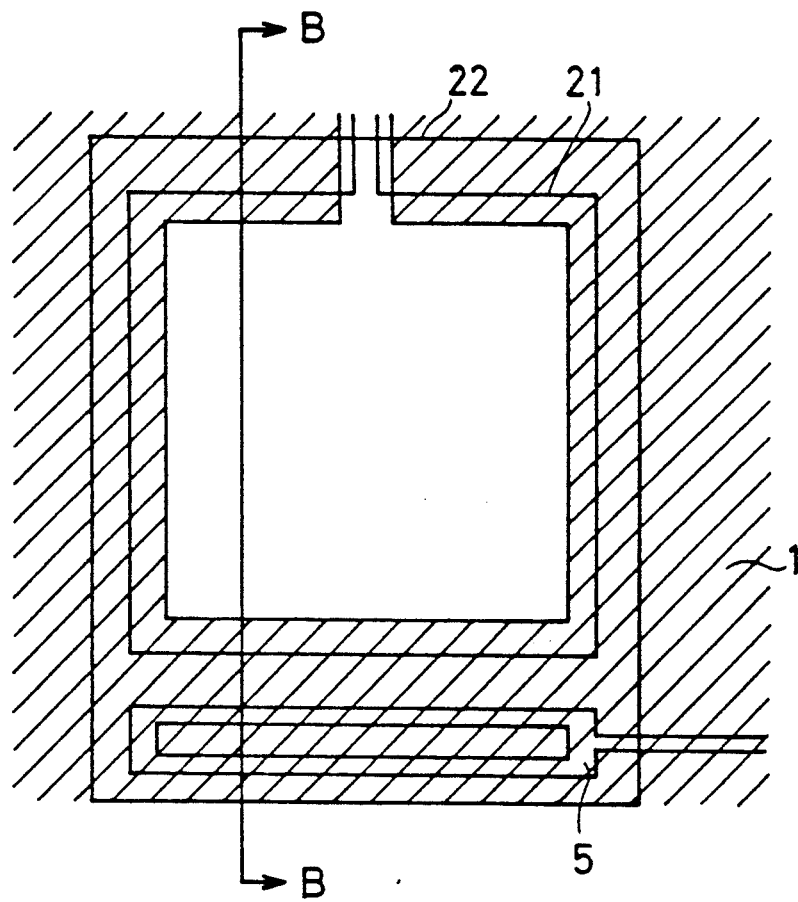
FIG. 4 is a plan view of a capacitor of a semiconductor integrated circuit device according to a second preferred embodiment of the present invention.
Figure 5:
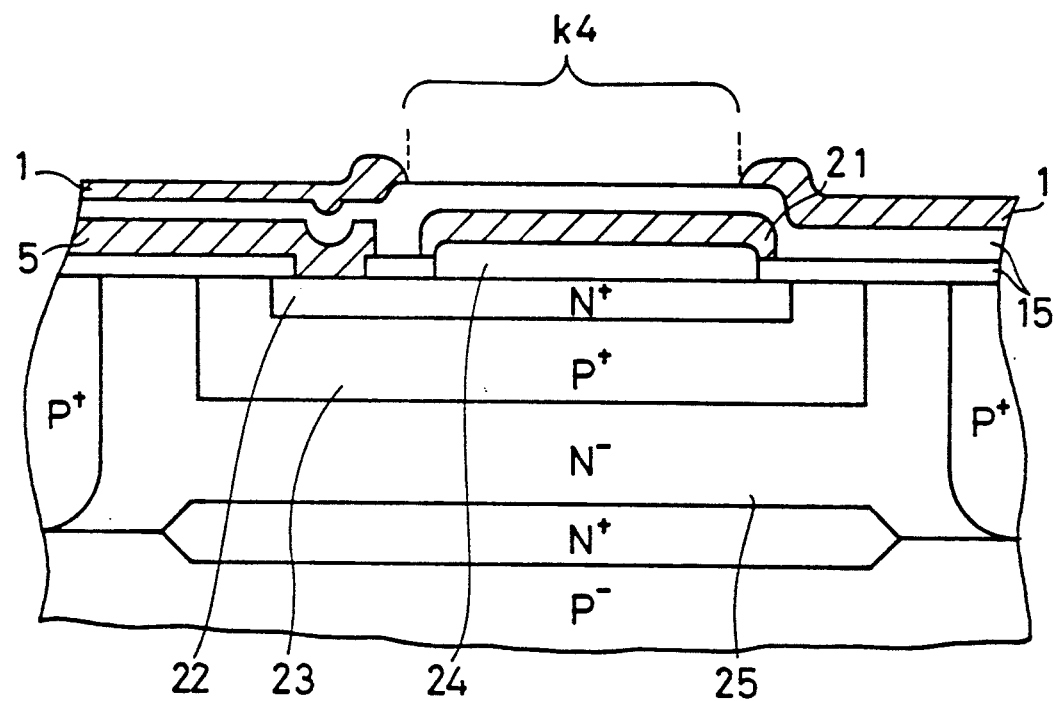
FIG. 5 is a sectional view taken along the lines B—B of FIG. 4 observed in the direction of the arrows.
Figure 14:
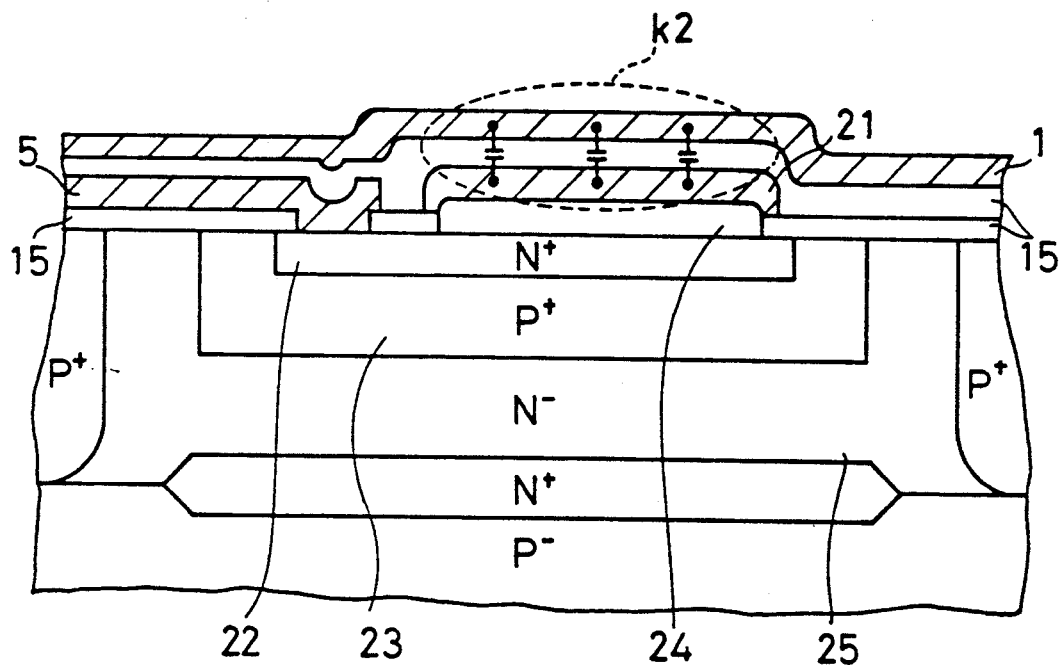
FIG. 14 is a sectional view of a capacitor of the conventional semiconductor integrated circuit device.

Next, a second preferred embodiment, wherein the present invention is applied to a nitride film capacitor whereto a high-frequency signal is applied, will be described with reference to FIGS. 4 and 5. FIG. 4 is a plan view showing a structure of a nitride film capacitor. FIG. 5 is a sectional view taken along the lines B—B of FIG. 4 observed in the direction of the arrows. In the figure, numeral 1 denotes a light shielding aluminum film, numeral 5 denotes a wiring, numeral 15 denotes a layer insulating film, numeral 21 denotes an aluminum electrode, numeral 22 denotes an N type semiconductor diffused layer, numeral 23 denotes a P type semiconductor diffused layer, numeral 24 denotes a nitride film, numeral 25 denotes an epitaxial growth layer and k4 denotes a region where the light shielding aluminum film 1 on the aluminum electrode 21 is removed. A capacitor is formed between the aluminum electrode 21 and the N type semiconductor diffused layer 22 across the nitride film 24. Compared with the sectional view of the capacitor of the conventional semiconductor integrated circuit device shown in FIG. 14, it is seen that parasitic capacity is not generated in the region k4 of FIG. 5 while it is generated in the region k2 of FIG. 14. For example, this nitride film capacitor can be employed as a capacitor provided in an IC, such as the capacitor 6 shown in FIG. 1 or the like.

Figure 6:
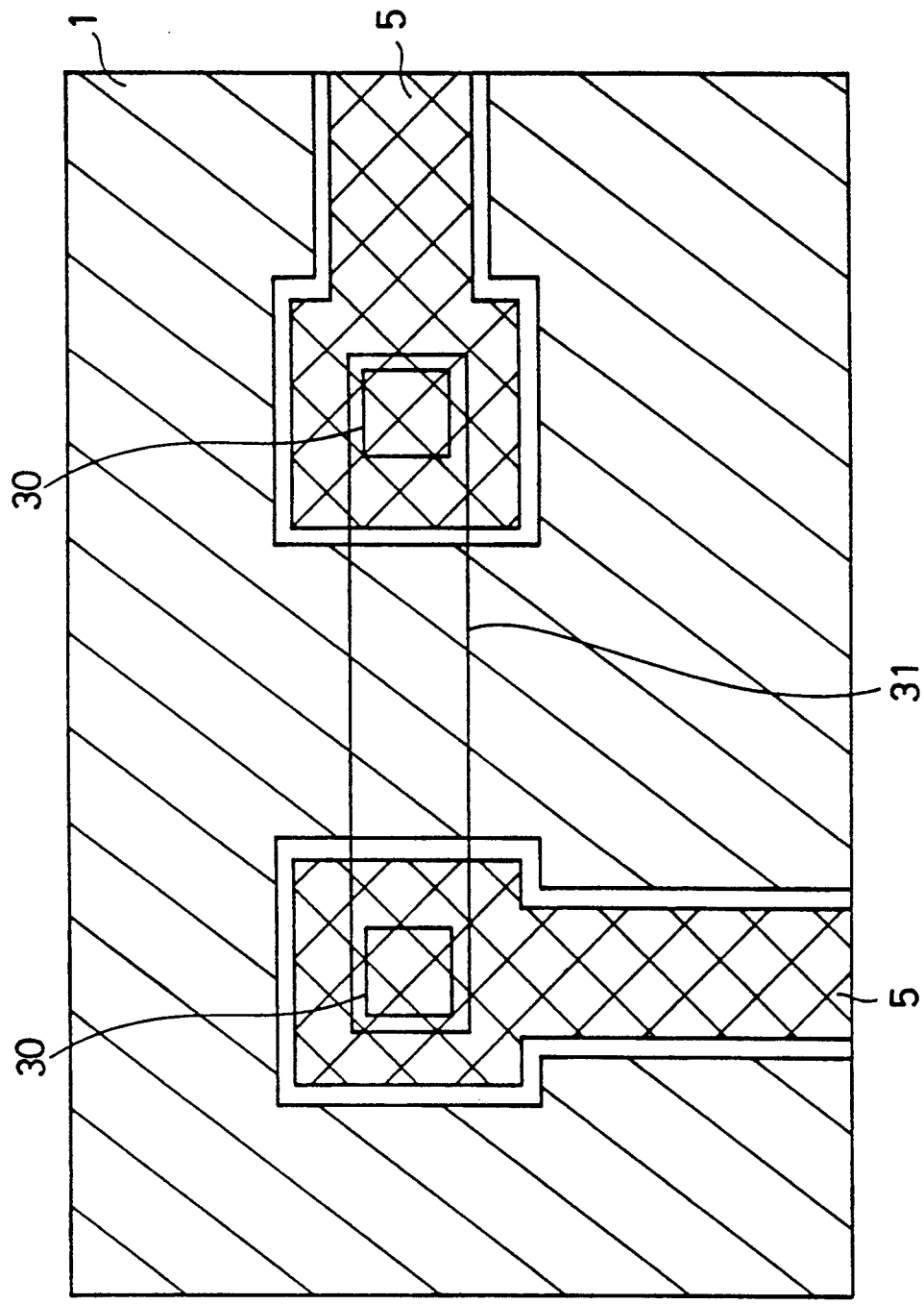
FIG. 6 is a plan view of a diffused resistor of a semiconductor integrated circuit device according to a third preferred embodiment of the present invention.

A third preferred embodiment, wherein the present invention is applied to a diffused resistor whereto a high-frequency signal is applied, will be described with reference to FIG. 6. FIG. 6 is a plan view showing a structure of a diffused resistor. In the figure, numeral 1 denotes a light shielding aluminum film, numeral 5 denotes a wiring, numeral 30 denotes a contact part and numeral 31 denotes a diffused resistor region. As shown in the figure, the light shielding aluminum film 1 on the wiring 5 and the contact part 30 which connects the diffused resistor 31 and the wiring 5 is removed. Thus, by removing the light shielding aluminum film 1, parasitic capacity can be reduced. For example, this diffused resistor can be employed as a resistor provided in the processing block B6 for processing a high-frequency signal in the IC shown in FIG. 1 or the like.

Figure 7:
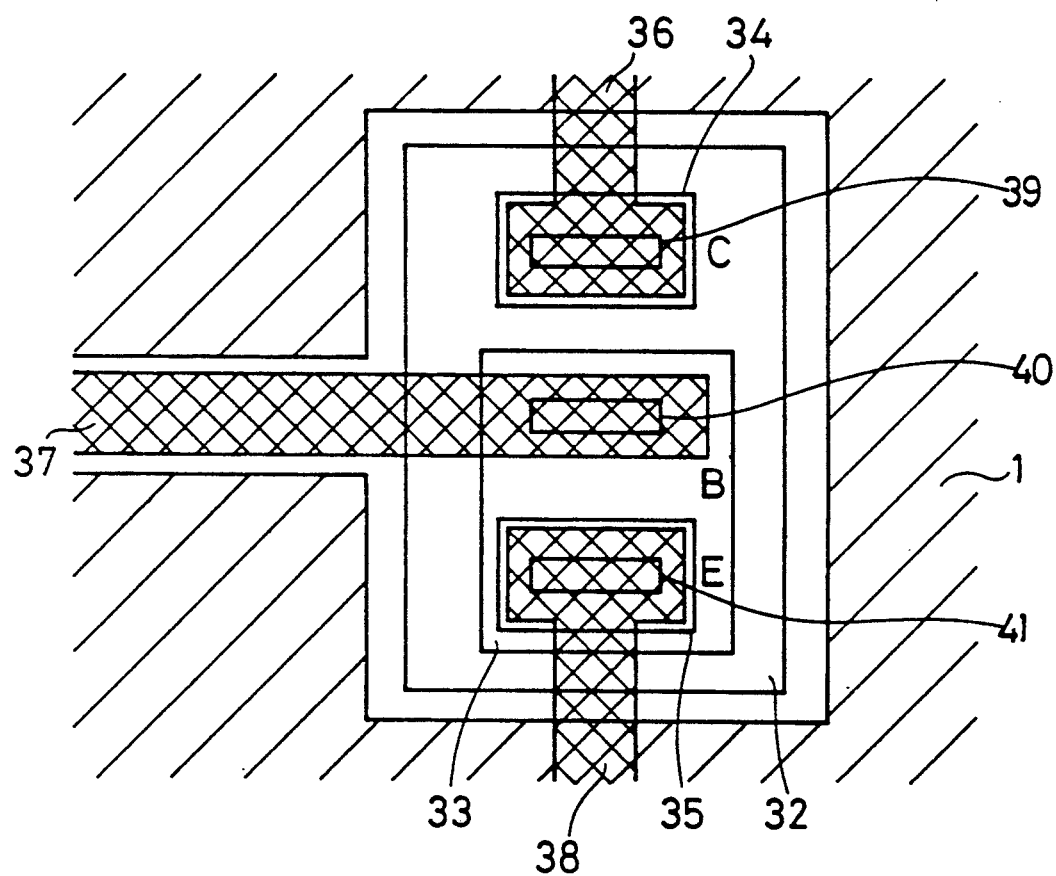
FIG. 7 is a plan view of a transistor of a semiconductor integrated circuit device according to a forth preferred embodiment of the present invention.
Figure 8:
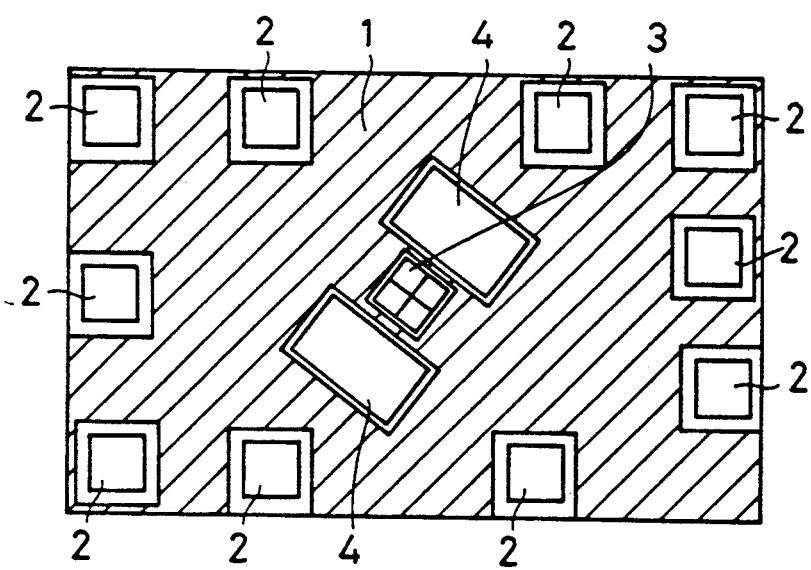
FIG. 8 is a plan view of a conventional semiconductor integrated circuit device with a built-in photosensor.

A forth preferred embodiment, wherein the present invention is applied to a transistor for processing a high-frequency signal, will be described with reference to FIG. 7. FIG. 7 is a plan view showing a structure of a transistor. In the figure, numeral 1 denotes a light shielding aluminum film, numeral 32 denotes an N type semiconductor diffused region, numeral 33 denotes a P type semiconductor diffused region, numerals 34 and 35 denote N+ type semiconductor diffused regions, numerals 36 through 38 denote wirings and numerals 39 through 41 denote contact parts. The transistor shown in this figure is an NPN bipolar transistor. The wiring 36 is in contact with the N type semiconductor diffused region 32 which composes a collector region through the N+ type diffused region 34 at the contact part 39. The N+ type diffused region 35 which composes an emitter region and the wiring 38 are connected at the contact part 41. The wiring 37 and the P type semiconductor diffused region 33 which composes a base region are connected at the contact part 40. Since the wiring 37 which is connected to the base has high input impedance, there can be great influence of parasitic capacity, and therefore the light shielding aluminum film 1 is not formed thereon. The transistor also processes a high-frequency signal, so that there can be great influence of parasitic capacity, and therefore the light shielding aluminum film 1 is removed. Thus, by removing the light shielding aluminum film 1, parasitic capacity can be reduced. For example, this transistor may be employed as a transistor provided in the high-frequency amplifier 9 of the processing block B6 or the like for processing a high-frequency signal in the IC shown in FIG. 1. Furthermore, while an example of an NPN bipolar transistor has been described in the above-mentioned forth preferred embodiment, a PNP bipolar transistor or other transistors may be employed to obtain a similar effect. While the light shielding aluminum film 1 is not removed on the wiring 38 which is connected to the emitter electrode in the above-mentioned forth preferred embodiment, the light shielding aluminum film 1 may be removed to obtain a similar effect when parasitic capacity is great, for example the wiring 38 is connected to an input terminal having high input impedance, and so forth.

While the invention has been shown and described in detail, the foregoing description is in all aspects illustrative and not restrictive. It is therefore understood that numerous modifications and variations can be devised without departing from the scope of the invention.

I claim:

1. A semiconductor integrated circuit device comprising:
   a substrate;
   a photosensor formed on said substrate;
   an integrated circuit formed on said substrate, having a circuit region which processes a signal outputted from said photosensor, for processing a signal outputted from said photosensor;
   a pad formed on said substrate, said pad being employed so that a signal can be input to and output from said integrated circuit; and
   a conductive light shielding film formed on the whole surface of said substrate except at least a portion of said circuit region which processes said signal outputted from said photosensor and a region whereon said photosensor and said pad are formed.

2. A semiconductor integrated circuit device in accordance with claim 1, wherein said conductive light shielding film comprises an aluminum film.

3. A semiconductor integrated circuit device comprising:
   a substrate;
   a photosensor formed on said substrate;
   an integrated circuit formed on said substrate, having a wiring which transmits a signal outputted from said photosensor, for processing said signal outputted from said photosensor;
   a pad formed on said substrate, said pad being employed so that a signal can be input to and output from said integrated circuit; and
   a conductive light shielding film formed on the whole surface of said substrate except at least a portion of said wiring and a region whereon said photosensor and said pad are formed.

4. A semiconductor integrated circuit device in accordance with claim 3, wherein said conductive light shielding film comprises an aluminum film.

5. A semiconductor integrated circuit device in accordance with claim 3, wherein
   said wiring has one end for receiving an output signal from said photosensor, and
   said integrated circuit further comprises an amplifier having an input end connected with the other end of said wiring, for amplifying said output signal form said photosensor.

6. A semiconductor integrated circuit device in accordance with claim 5, wherein said integrated circuit further comprises a capacitor inserted in said wiring for filtering said output signal from said photosensor.

7. A semiconductor integrated circuit device in accordance with claim 3, wherein
   said wiring has one end for receiving an output signal from said photosensor, and
   said integrated circuit further comprises a capacitor having one end connected with the other end of said wiring, for filtering said output signal from said photosensor.

8. A semiconductor integrated circuit device in accordance with claim 7, wherein said one end of said wiring is immediately connected with an output end of said photosensor.

9. A semiconductor integrated circuit device comprising:
   a substrate;
   a photosensor formed on said substrate;
   an integrated circuit formed on said substrate, having a capacitor whereto a signal outputted from said photosensor is applied, for processing said signal outputted from said photosensor;
   a pad formed on said substrate, said pad being employed so that a signal can be input to and output from said integrated circuit; and
   a conductive light shielding film formed on the whole surface of said substrate except at least a portion of said capacitor and a region whereon said photosensor and said pad are formed.

10. A semiconductor integrated circuit device in accordance with claim 9, wherein said conductive light shielding film comprises an aluminum film.

11. A semiconductor integrated circuit device in accordance with claim 9, wherein
    said capacitor comprising:
    a first conductive layer formed on said substrate;
    an insulating layer formed on said first conductive layer; and
    a second conductive layer formed on said insulating layer.

12. A semiconductor integrated circuit device in accordance with claim 11, wherein said first conductive layer comprises a semiconductor layer wherein impurity is diffused.

13. A semiconductor integrated circuit device in accordance with claim 11, wherein said first conductive layer comprises an aluminum layer.

14. A semiconductor integrated circuit device comprising:
    a substrate;
    a photosensor formed on said substrate;
    an integrated circuit formed on said substrate, having a resistor whereto a signal outputted from said photosensor is applied, for processing said signal outputted from said photosensor;
    a pad formed on said substrate, said pad being employed so that a signal can be input to and output from said integrated circuit; and
    a conductive light shielding film formed on the whole surface of said substrate except at least a portion of said resistor and a region whereon said photosensor and said pad are formed.

15. A semiconductor integrated circuit device in accordance with claim 14, wherein said conductive light shielding film comprises an aluminum film.

16. A semiconductor integrated circuit device in accordance with claim 14, wherein said resistor comprises a diffused resistor.

17. A semiconductor integrated circuit device in accordance with claim 14, wherein said portion of said resistor comprises a contact of said resistor.

18. A semiconductor integrated circuit device comprising:
    a substrate;
    a photosensor formed on said substrate;
    an integrated circuit formed on said substrate, having a transistor which processes a signal outputted from said photosensor, for processing said signal outputted from said photosensor;

a pad formed on said substrate, said pad being employed so that a signal can be input to and output from said integrated circuit; and a conductive light shielding film formed on the whole surface of said substrate except at least a portion of said transistor and a region whereon said photosensor and said pad are formed.

19. A semiconductor integrated circuit device in accordance with claim 18, wherein said conductive light shielding film comprises an aluminum film.

20. A semiconductor integrated circuit device in accordance with claim 18, wherein said transistor comprises a planar transistor.

* * * * *